United States Patent
Miyano (10) Patent No.: US 9,570,149 B2
(45) Date of Patent: Feb. 14, 2017

(54) OUTPUT SIGNAL GENERATION DEVICE HAVING A PHASE ADJUSTMENT UNIT AND METHOD FOR ADJUSTING A PHASE DIFFERENCE BETWEEN AN INPUT AND AN OUTPUT SIGNAL

(71) Applicant: PS4 Luxco S.a.r.l., Luxembourg (LU)

(72) Inventor: Kazutaka Miyano, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/761,557

(22) PCT Filed: Jan. 15, 2014

(86) PCT No.: PCT/JP2014/050541
§ 371 (c)(1),
(2) Date: Jul. 16, 2015

(87) PCT Pub. No.: WO2014/112509
PCT Pub. Date: Jul. 24, 2014

(65) Prior Publication Data
US 2015/0364181 A1 Dec. 17, 2015

(30) Foreign Application Priority Data
Jan. 16, 2013 (JP) .................. 2013-005411

(51) Int. Cl.
*G11C 7/00* (2006.01)
*G11C 11/4076* (2006.01)
(Continued)

(52) U.S. Cl.
CPC ......... *G11C 11/4076* (2013.01); *G11C 7/1066* (2013.01); *G11C 11/4074* (2013.01);
(Continued)

(58) Field of Classification Search
CPC ........ G11C 7/1078; G11C 7/22; G11C 7/1006
(Continued)

(56) References Cited

U.S. PATENT DOCUMENTS

| 7,755,401 B2 * | 7/2010 | Abe ...................... H03L 7/0814 |
| | | 327/149 |
| 2008/0052555 A1 | 2/2008 | Kobayashi et al. |

(Continued)

FOREIGN PATENT DOCUMENTS

| JP | 09321621 | 12/1997 |
| JP | 2007300591 | 11/2007 |

OTHER PUBLICATIONS

Application No. PCT/JP2014/050541, International Search Report, Apr. 28, 2014.

*Primary Examiner* — Connie Yoha
(74) *Attorney, Agent, or Firm* — Kunzler Law Group, PC (57) ABSTRACT

An output signal generation device in accordance with disclosed embodiments includes: a phase adjustment unit that generates an output signal on the basis of an input signal and is capable of executing an adjustment operation of setting the phase difference between the input signal and the output signal to a predetermined value; a holding unit that holds a reference voltage; a comparison voltage generation unit that generates a comparison voltage that is dependent on a power supply voltage; and a control unit that intermittently compares the comparison voltage with the reference voltage held in the holding unit, causes the phase adjustment circuit to execute the adjustment operation when the comparison result satisfies a predetermined condition representing a variation in the power supply voltage, and changes the reference voltage held in the holding unit in accordance with the power supply voltage.

8 Claims, 4 Drawing Sheets (51) Int. Cl.
- *G11C 11/4093* (2006.01)
- *G11C 11/4074* (2006.01)
- *H03K 5/24* (2006.01)
- *H03L 7/081* (2006.01)
- G11C 7/10 (2006.01)
- G11C 7/22 (2006.01)

(52) U.S. Cl.
CPC ............ *G11C 11/4093* (2013.01); *H03K 5/24* (2013.01); *H03L 7/0812* (2013.01); *H03L 7/0814* (2013.01); *G11C 7/1006* (2013.01); *G11C 7/106* (2013.01); *G11C 7/1039* (2013.01); *G11C 7/1078* (2013.01); *G11C 7/22* (2013.01)

(58) Field of Classification Search
USPC ................ 365/189.16, 189.08, 226, 233
See application file for complete search history.

(56) References Cited

U.S. PATENT DOCUMENTS

| | | | |
|---|---|---|---|
| 2010/0321059 A1* | 12/2010 | Nakatsu | H03K 19/01750 326/30 |
| 2011/0057697 A1* | 3/2011 | Miyano | H03L 7/0814 327/158 |
| 2011/0058437 A1 | 3/2011 | Miyano | |

\* cited by examiner

OUTPUT SIGNAL GENERATION DEVICE HAVING A PHASE ADJUSTMENT UNIT AND METHOD FOR ADJUSTING A PHASE DIFFERENCE BETWEEN AN INPUT AND AN OUTPUT SIGNAL

TECHNICAL FIELD

The present invention relates to an output signal generation device, a semiconductor device and an output signal generation method, and in particular the present invention relates to an output signal generation device for generating an output signal in accordance with an input signal, and to a semiconductor device and an output signal generation method.

BACKGROUND

A synchronous memory for performing operations synchronously with a clock signal is widely used as a memory in a personal computer or the like. In the case of a DDR (Double Data Rate) synchronous memory, output data must be synchronized with an external clock signal, so a DLL (Delay Line Loop) circuit is installed in order to generate an internal clock signal synchronized with the external clock signal.

A DLL circuit comprises: a counter circuit in which a count value is updated in accordance with the phase difference between an external clock signal and an internal clock signal; and a delay line which delays the external clock signal in accordance with the counter value of the counter circuit, and generates the internal clock signal.

The counter value, in other words the amount of delay in the delay line, can produce data synchronization at a timing with a determined counter value. However, if the operating current of an output transistor varies over time due to a power fluctuation in particular, the data output timing varies and the data synchronization is lost. It is therefore known that adjustment of the counter value is carried out intermittently rather than being concluded at one time.

The operation to update the counter value of a counter circuit and to delay an external clock signal in accordance with the updated counter value will be referred to below as a "phase adjustment operation".

Patent Document 1 describes a semiconductor device equipped with a DLL circuit, in which power consumption is reduced by restricting execution of phase adjustment operations for which there is only a small need. The semiconductor device described in Patent Document 1 executes a phase adjustment operation when a power source voltage fluctuates with an acceleration equal to or greater than a predetermined value.

PATENT DOCUMENTS

Patent Document 1: JP 2011-61457 A

SUMMARY OF THE INVENTION

Problem to be Solved by the Invention

A novel means for reducing power consumption accompanying phase adjustment operations by restricting execution of phase adjustment operations for which there is only a small need would be desirable at the present time.

Means for Solving the Problem

An output signal generation device according to the present invention includes: a phase adjustment unit which can generate an output signal in accordance with an input signal, and can execute an adjustment operation in which the phase difference between the input signal and the output signal is set to a predetermined value;
a holding unit for holding a reference voltage;
a comparison voltage generation unit for generating a comparison voltage dependent on a power source voltage; and
a control unit which intermittently compares the comparison voltage and the reference voltage held in the holding unit, and if the comparison result satisfies a predetermined condition indicating a fluctuation in the power source voltage, said control unit causes the phase adjustment unit to execute the adjustment operation, and also alters the reference voltage held in the holding unit, in accordance with the power source voltage.

Furthermore, the output signal generation method according to the present invention is performed by an output signal generation device including a phase adjustment unit which can generate an output signal in accordance with an input signal, and can execute an adjustment operation in which the phase difference between the input signal and the output signal is set to a predetermined value, in which method:
a reference voltage is held in a holding unit;
a comparison voltage dependent on a power source voltage is generated; and
the comparison voltage and the reference voltage held in the holding unit are intermittently compared, and if the comparison result satisfies a predetermined condition indicating a fluctuation in the power source voltage, the phase adjustment unit is caused to execute the adjustment operation, and the reference voltage held in the holding unit is also altered in accordance with the power source voltage.

Advantage of the Invention

According to the present invention, it is determined whether or not a phase adjustment operation should be implemented in accordance with the result of comparing a reference voltage and a comparison voltage, and if the phase adjustment operation is implemented, the reference voltage is altered in accordance with the power source voltage. It is therefore possible to update the reference voltage which is compared with the comparison voltage to a value commensurate with the power source voltage at the time of the most recent phase adjustment operation. This means that when the power source voltage is stable and the comparison voltage is stable after the most recent phase adjustment operation, for example, there is a high possibility that the result of comparing the updated reference voltage and comparison voltage will no longer satisfy a predetermined condition indicating a fluctuation in the power source voltage. Accordingly, it is possible to restrict execution of a phase adjustment operation for which there is only a small need.

BRIEF DESCRIPTION OF THE FIGURES

FIG. 2 is a diagram showing a phase adjustment circuit 107a.

MODE OF EMBODIMENT OF THE INVENTION

A mode of embodiment of the present invention will be described below with reference to the figures.

Figure 1:
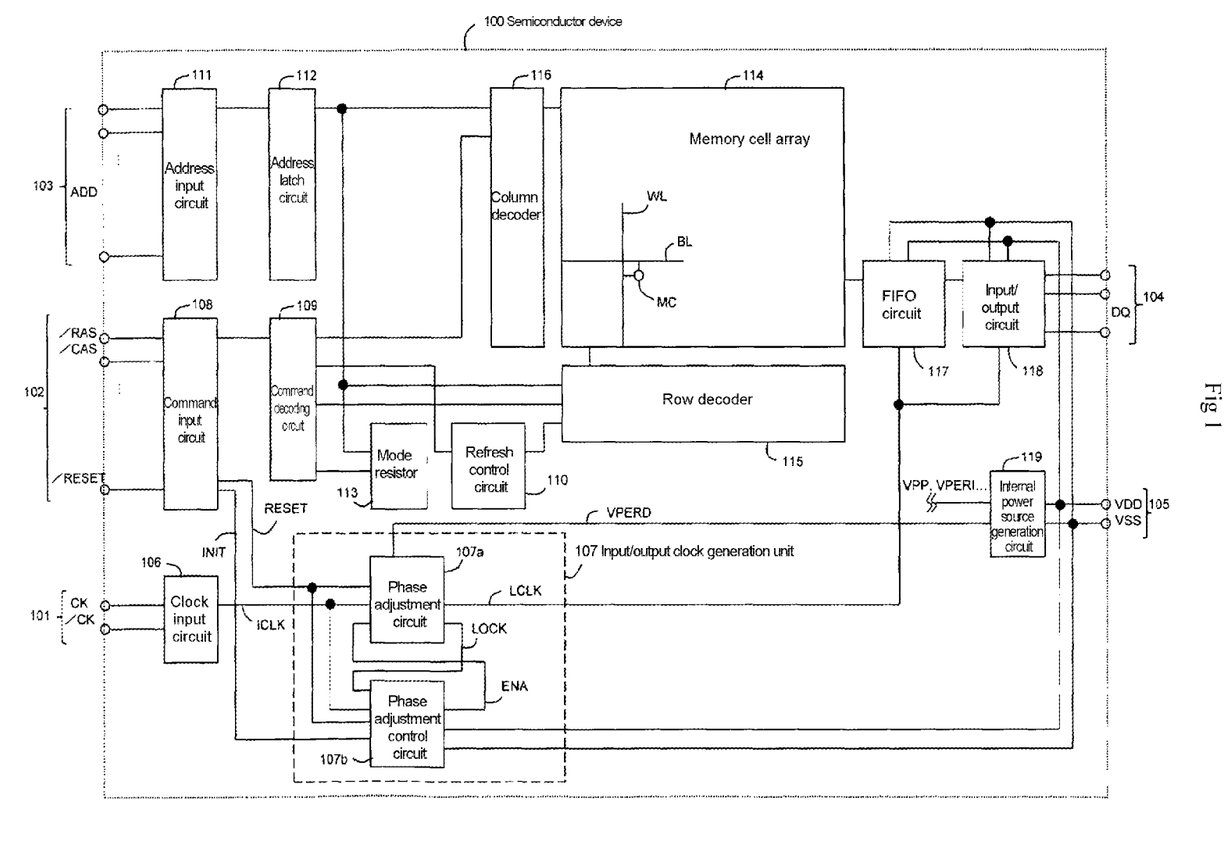
FIG. 1 is a diagram showing a semiconductor device 100 according to a mode of embodiment of the present invention.

FIG. 1 is a diagram showing a semiconductor device 100 according to a mode of embodiment of the present invention. In this mode of embodiment, a RAM (Random Access Memory) is used as the semiconductor device 100.

The semiconductor device 100 includes, as external terminals: a clock terminal group 101, a command terminal group 102, an address terminal group 103, a data input/output terminal group 104 and a power source terminal group 105.

Furthermore, the semiconductor device 100 includes: a clock input circuit 106, an input/output clock generation unit 107, a command input circuit 108, a command decoding circuit 109, a refresh control circuit 110, an address input circuit 111, an address latch circuit 112, a mode resistor 113, a memory cell array 114, a row decoder 115, a column decoder 116, a FIFO (First-In First-Out) circuit 117, an input/output circuit 118 and an internal power source generation circuit 119.

The clock terminal group 101 receives external clock signals CK and /CK.

It should be noted that the symbol "/" appended to the start of a signal name in the present specification means that the relevant signal is a low-active signal or an inverse signal of the corresponding signal. The external clock signal CK and the external clock signal /CK are therefore complementary signals.

The clock input circuit 106 receives the external clock signals CK and /CK from the clock terminal group 101 and uses the external clock signals CK and /CK to generate an internal clock signal ICLK. The clock input circuit 106 outputs the internal clock signal ICLK to the input/output clock generation unit 107.

The input/output clock generation unit 107 generates an input/output clock signal LCLK by adjusting the phase of the internal clock signal ICLK.

The input/output clock generation unit 107 is an example of an output signal generation device, the internal clock signal ICLK is an example of an input signal, and the input/output clock signal LCLK is an example of an output signal.

The input/output clock generation unit 107 includes a phase adjustment circuit 107a and a phase adjustment control circuit 107b.

The phase adjustment circuit 107a is an example of a phase adjustment unit, for example a DLL circuit. The phase adjustment circuit 107a generates the input/output clock signal LCLK in accordance with the internal clock signal ICLK. Furthermore, the phase adjustment circuit 107a can execute a phase adjustment operation in which the phase difference between the internal clock signal ICLK and the input/output clock signal LCLK is set to a predetermined value.

The phase adjustment control circuit 107b determines the adjustment timing for execution of the phase adjustment operation by the phase adjustment circuit 107a. The phase adjustment control circuit 107b outputs an enable signal ENA to the phase adjustment circuit 107a at the adjustment timing. The enable signal ENA is an example of an adjustment signal. The phase adjustment circuit 107a executes the phase adjustment operation when it receives the enable signal ENA.

The input/output clock signal LCLK generated by the phase adjustment circuit 107a is supplied to the FIFO circuit 117 and the input circuit 118. The FIFO circuit 117 and the input/output circuit 118 will be described later.

The command terminal group 102 receives command signals. Command signals include, for example, a row address strobe signal /RAS, a column address strobe signal /CAS, and a reset signal /RESET.

The command input circuit 108 receives a command signal from the command signal group 102 and outputs a command signal to the command decoding circuit 109. Furthermore, the command input circuit 108 outputs a reset signal RESET to the phase adjustment circuit 107a and to the phase adjustment control circuit 107b, and outputs an initialization signal INIT to the phase adjustment control circuit 107b.

The command decoding circuit 109 receives a command signal. The command decoding circuit 109 generates an internal command signal by holding the command signals, decoding the command signals and counting the command signals, among other things. The command decoding circuit 109 generates, as internal command signals, a refresh command, a write command and a read command, for example.

The refresh control circuit 110 receives a refresh command from the command decoding circuit 109. When the refresh control circuit 110 receives the refresh command, it sends a refresh signal to the row decoder 115.

The address terminal group 103 receives address signals.

The address input circuit 111 receives an address signal from the address terminal group 103 and outputs the address signal to the address latch circuit 112.

The address latch circuit 112 receives the address signal from the address input circuit 111. The address latch circuit 112 outputs the address signal to the mode resistor 113 when the mode resistor 113 is set. Furthermore, the address latch circuit 112 outputs a row address from the address signal to the row decoder 115 and outputs a column address from the address signal to the column decoder 116.

The mode resistor 113 is a resistor in which operating parameters (e.g., burst length or CAS latency) of the semiconductor device 100 are set. The mode register 113 receives an internal command signal from the command decoding circuit 109 and an address signal from the address latch circuit 112, and operating parameters established in accordance with the internal command signal and the address signal are set.

The memory array 114 includes a plurality of word lines WL, a plurality of bit lines BL, and a plurality of memory cells MC. The memory cells MC are specified by the word lines WL and the bit lines BL.

The row decoder 115 receives a row address from the address latch circuit 112 and a write command or read command from the command decoding circuit 109. Furthermore, the row decoder 115 receives a refresh signal from the refresh control circuit 110. When the row decoder 115 receives a write command or a read command, it selects a word line WL commensurate with the row address from among the plurality of word lines WL in the memory cell array 114.

The plurality of word lines WL and the plurality of bit lines BL intersect inside the memory cell array 114, and the memory cells MC are disposed at the point of intersection. It should be noted that in FIG. 1, only one word line WL, one bit line BL and one memory cell MC are shown in order to simplify the description. The bit lines BL are each connected to a sense amplifier (not depicted) corresponding to its own bit line BL.

Furthermore, when the row decoder 115 receives a refresh signal, it selects a word line WL commensurate with a row address from among the plurality of word lines WL, and executes self-refreshment in which the memory cell MC corresponding to the selected word line WL is refreshed.

The column decoder 116 receives a column address from the address latch circuit 112 and a write command or read command from the command decoding circuit 109.

When the column decoder 116 receives the column address and a write command or read command, it selects a sense amplifier commensurate with the column address from among the plurality of sense amplifiers.

During a read operation (when a read command has been generated), data (read data) from within the memory cell MC present at the point of intersection between the bit line BL connected to the sense amplifier selected by the column decoder 116 and the word line WL selected by the row decoder 115 (this memory cell is referred to below as the "selected memory cell") is amplified by the sense amplifier selected by the column decoder 116 and supplied to the FIFO circuit 117, after which it is supplied to the input/output circuit 118. On the other hand, during a write operation (when a write command has been generated), the sense amplifier selected by the column decoder 116 writes write data from the FIFO circuit 117 to the selected memory cell.

The FIFO circuit 117 receives the input/output clock signal LCLK from the phase adjustment circuit 107a, and exchanges read data and write data between the memory cell array 114 and the input/output circuit 118 synchronously with the input/output clock signal LCLK.

The data input/output terminal group 104 outputs read data and inputs write data. The data input/output terminal group 104 is connected to the input/output circuit 118.

The input/output circuit 118 receives the input/output clock signal LCLK from the phase adjustment circuit 107a and, during a read operation, outputs read data to the data input/output terminal group 104 synchronously with the input/output clock signal LCLK.

The power source terminal group 105 receives a voltage VDD on the high-potential side of a power source voltage, and a voltage VSS on the low-potential side of the power source voltage.

The internal power source generation circuit 119 receives the voltage VDD and the voltage VSS from the power source terminal group 105 and generates internal power source voltages such as a voltage VPP, a voltage VPERI and a voltage VPERD. It should be noted that the voltage VDD and the voltage VSS are also supplied to the phase adjustment control circuit 107b, the FIFO circuit 117 and the input/output circuit 118.

Figure 2:
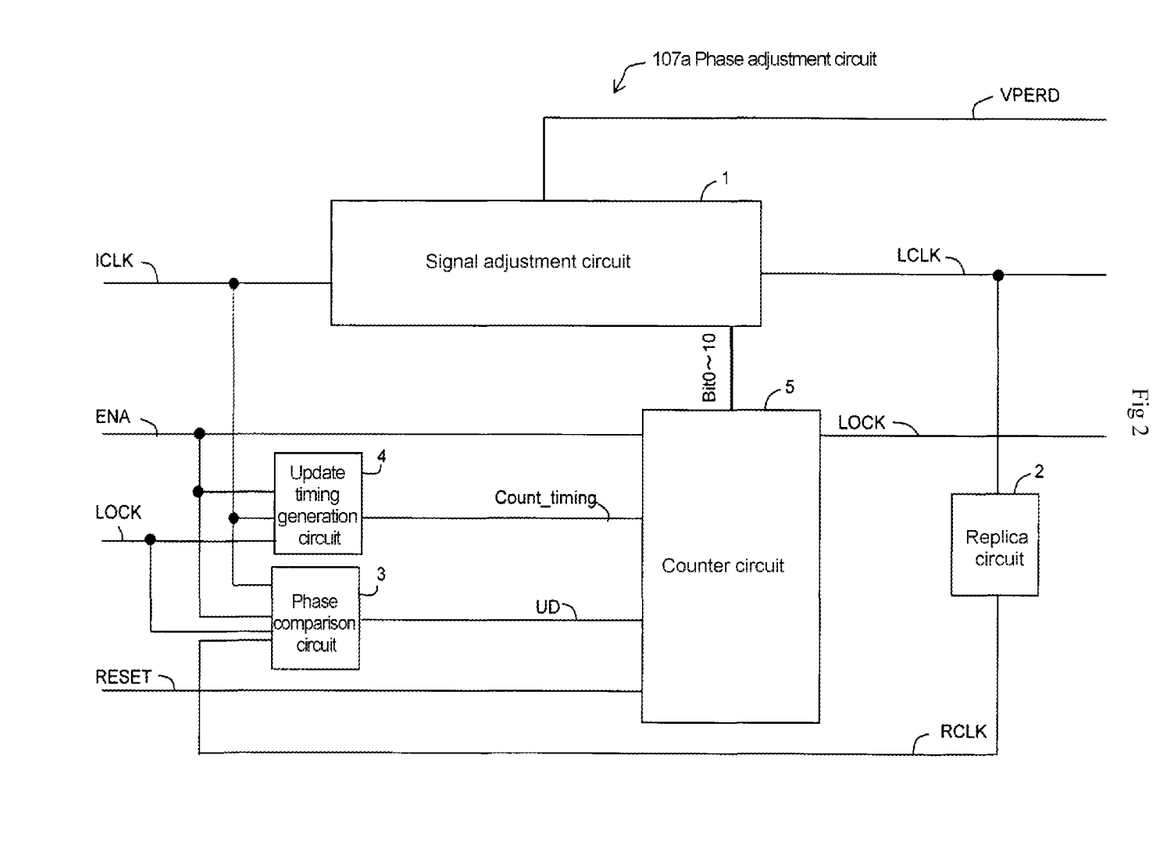

The phase adjustment circuit 107a will be described next.

FIG. 2 shows the phase adjustment circuit 107a. In FIG. 2, the phase adjustment circuit 107a includes: a signal adjustment circuit 1, a replica circuit 2, a phase comparison circuit 3, an update timing generation circuit 4 and a counter circuit 5.

The signal adjustment circuit 1 is a delay line, for example, and it generates an input/output clock signal LCLK by delaying the internal clock signal ICLK. The voltage VPERD is supplied to the signal adjustment circuit 1.

Although there is no particular limitation, the signal adjustment circuit 1 may include a coarse delay line for delaying the internal clock signal ICLK at a relatively coarse adjustment pitch, and a fine delay line for delaying the internal clock signal ICLK at a relatively fine adjustment pitch.

The input/output clock signal LCLK is supplied to the FIFO circuit 117 and input/output circuit 118 shown in FIG. 1, and to the replica circuit 2.

The replica circuit 2 is a circuit having an amount of delay equivalent to the amount of delay produced in the actual signal route from the signal adjustment circuit 1 to the output terminal group 104 (referred to below simply as the "signal route").

The replica circuit 2 outputs a replica clock signal RCLK in which the input/output clock signal LCLK is delayed by the amount of delay produced in the signal route. As a result, the phase of the replica clock signal RCLK matches the phase of the signal output from the data input/output terminal group 104.

The phase comparison circuit 3 is started as the enable signal ENA is input, and is stopped as a lock signal LOCK is input.

The lock signal LOCK is output from the counter circuit 5 when the phase of the internal clock signal ICLK and the phase of the replica clock signal RCLK are matching.

When the phase comparison circuit 3 is started, it detects the phase difference between the internal clock signal ICLK and the replica clock signal RCLK.

As described above, the phase of the replica clock signal RCLK is adjusted by means of the signal adjustment circuit 1 in such a way as to match the phase of an output signal from the data input/output terminal group 104. However, the phases of the two vary from moment to moment because of fluctuations in parameters affecting the amount of delay of the signal adjustment circuit 1, such as pressure or temperature, and because of fluctuations in the frequency of the actual internal clock signal ICLK, among other things.

The phase comparison circuit 3 detects variations such as these and determines whether the replica clock signal RCLK should be advanced or delayed with respect to the internal clock signal ICLK. This determination is made for each period of the internal clock signal ICLK while the phase comparison circuit 3 is operating.

The determination result is supplied to the counter circuit 5 as a phase determination signal UD. For example, when the replica clock signal RCLK is advanced with respect to the internal clock signal ICLK, the phase determination signal UD becomes "H", and when the replica clock signal RCLK is delayed with respect to the internal clock signal ICLK, the phase determination signal UD becomes "L".

The update timing generation circuit 4 is started as the enable signal ENA is input, and is stopped as a lock signal LOCK is input, in the same way as the phase comparison circuit 3.

When the update timing generation circuit 4 is started, it generates a count timing signal Count_timing which is a one-shot pulse, by dividing the internal clock signal ICLK. The count timing signal Count_timing is output to the counter circuit 5 and is used as a synchronized signal indicating the timing for updating the count value of the counter circuit 5. The activation period of the count timing signal Count_timing is therefore defined as the sampling period of the phase adjustment circuit 107a.

The counter circuit 5 is started as the enable signal ENA is input, and is stopped as a lock signal LOCK is output.

The counter circuit 5 sets the amount of delay of the signal adjustment circuit 1.

The count value of the counter circuit 5 is updated synchronously with the count timing signal Count_timing. Any increase or reduction in the count value is determined in accordance with the phase determination signal UD supplied from the phase comparison circuit 3.

In this mode of embodiment, when the phase determination signal UD is "H", the counter circuit 5 raises the count of the count value synchronously with the count timing signal Count_timing, and the amount of delay of the signal adjustment circuit 1 is increased as a result. Conversely, when the phase determination signal UD is "L", the counter circuit 5 lowers the count of the count value synchronously with the count timing signal Count_timing, and the amount of delay of the signal adjustment circuit 1 is reduced as a result.

When the counter circuit 5 has alternately repeated the count raising and count lowering a predetermined number of times (e.g., twice) it then determines that the phase of the internal clock signal ICLK and the phase of the replica clock signal RCLK are matching, outputs an activated lock signal LOCK while holding the count value at that time, and then stops operation. It should be noted that the counter circuit 5 also holds the count value while operation is stopped.

Furthermore, the reset signal RESET is also supplied to the counter circuit 5. When the reset circuit RESET is activated, the counter circuit 5 initializes the count value to a preset value.

Figure 3:
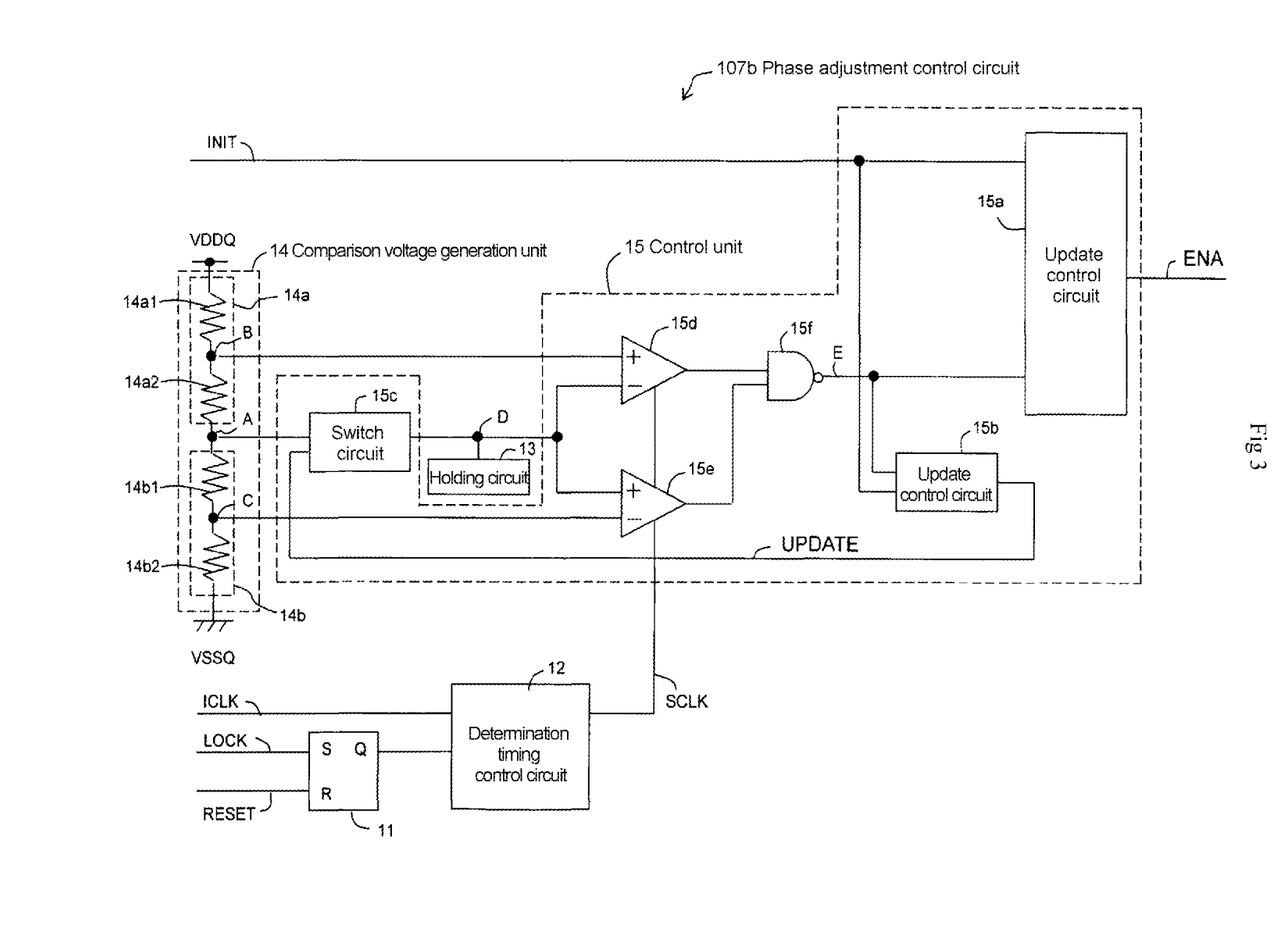
FIG. 3 is a diagram showing a phase adjustment control circuit 107b.

The phase adjustment control circuit 107b will be described next.

FIG. 3 shows the phase adjustment control circuit 107b. In FIG. 3, the phase adjustment control circuit 107b includes: an SR latch 11, a determination timing control circuit 12, a holding circuit 13, a comparison voltage generation unit 14 and a control unit 15.

The SR latch 11 receives a lock signal LOCK at a set terminal S and receives a reset signal RESET at a reset terminal R. Therefore, when the lock signal LOCK is activated ("H"), the SR latch 11 activates ("H") an output signal from an output terminal Q, and when the reset signal RESET is activated ("H"), the SR latch 11 deactivates ("L") an output signal from the output terminal Q.

The determination timing control circuit 12 is in an active state while the output signal of the SR latch 11 is activated. During the active state, the determination timing control circuit 12 outputs an activated comparison timing signal SCLK each time the internal clock signal ICLK counts a predetermined number of times.

The holding circuit 13 is an example of a holding unit. The holding circuit 13 holds the reference voltage. A capacitor is used as the holding circuit 13, for example.

The comparison voltage generation unit 14 generates a comparison voltage dependent on power source voltage VDDQ and VSSQ (ground).

The comparison voltage generation unit 14 has resistors 14a and 14b. The resistor 14a is an example of a first resistor. The resistor 14b is an example of a second resistor. The resistor 14a and the resistor 14b are connected in series between the power source voltage VDDQ and VSSQ, and divide the power source voltage VDDQ. The resistor 14a has a resistor 14a1 and a resistor 14a2 which are connected in series. The resistor 14b has a resistor 14b1 and a resistor 14b2 which are connected in series. The values of these resistors may be the same as each other or they may be different from each other.

The comparison voltage generation unit 14 generates, as the comparison voltage, a voltage at a connection B of the resistors 14a1, 14a2, and a voltage at a connection C of the resistors 14b1, 14b2.

The control unit 15 intermittently compares the comparison voltage and the reference voltage held in the holding circuit 13. If the comparison result satisfies a predetermined condition indicating a fluctuation in the power source voltage, the control unit 15 causes the phase adjustment circuit 107a to execute a phase adjustment operation and also alters the reference voltage held in the holding circuit 13, in accordance with the power source voltage VDDQ.

The control unit 15 includes update control circuits 15a and 15b, a switch circuit 15c, comparison circuits 15d and 15e, and a NAND circuit 15f.

The update control circuit 15a is an OR circuit, for example, which outputs an activated enable signal ENA on receiving an initialization signal INIT or an activated output signal ("H") of the NAND circuit 15f.

The update control circuit 15b is an OR circuit, for example, which outputs an activated update signal UPDATE on receiving an initialization signal INIT or an activated output signal of the NAND circuit 15f.

The switch circuit 15c is connected to the connection A of the resistor 14a and the resistor 14b, and to the holding circuit 13; the switch circuit 15c is ON when it receives the activated update signal UPDATE. A transfer gate is used as the switch circuit 15c, for example.

While the activated comparison timing signal SCLK is being received, the comparison circuit 15d compares the voltage at the connection B and the reference voltage held in the holding circuit 13. It should be noted that the comparison circuit 15d outputs an "H"-level signal when the activated comparison timing signal is not being received.

While the activated comparison timing signal SCLK is being received, the comparison circuit 15e compares the voltage at the connection C and the reference voltage held in the holding circuit 13. It should be noted that the comparison circuit 15e outputs an "H"-level signal when the activated comparison timing signal is not being received.

The NAND circuit 15f receives the output of the comparison circuits 15d and 15e, and outputs a NAND logical operation result of the respective outputs to the update control circuits 15a and 15b.

The operation will be described next.

Figure 4:
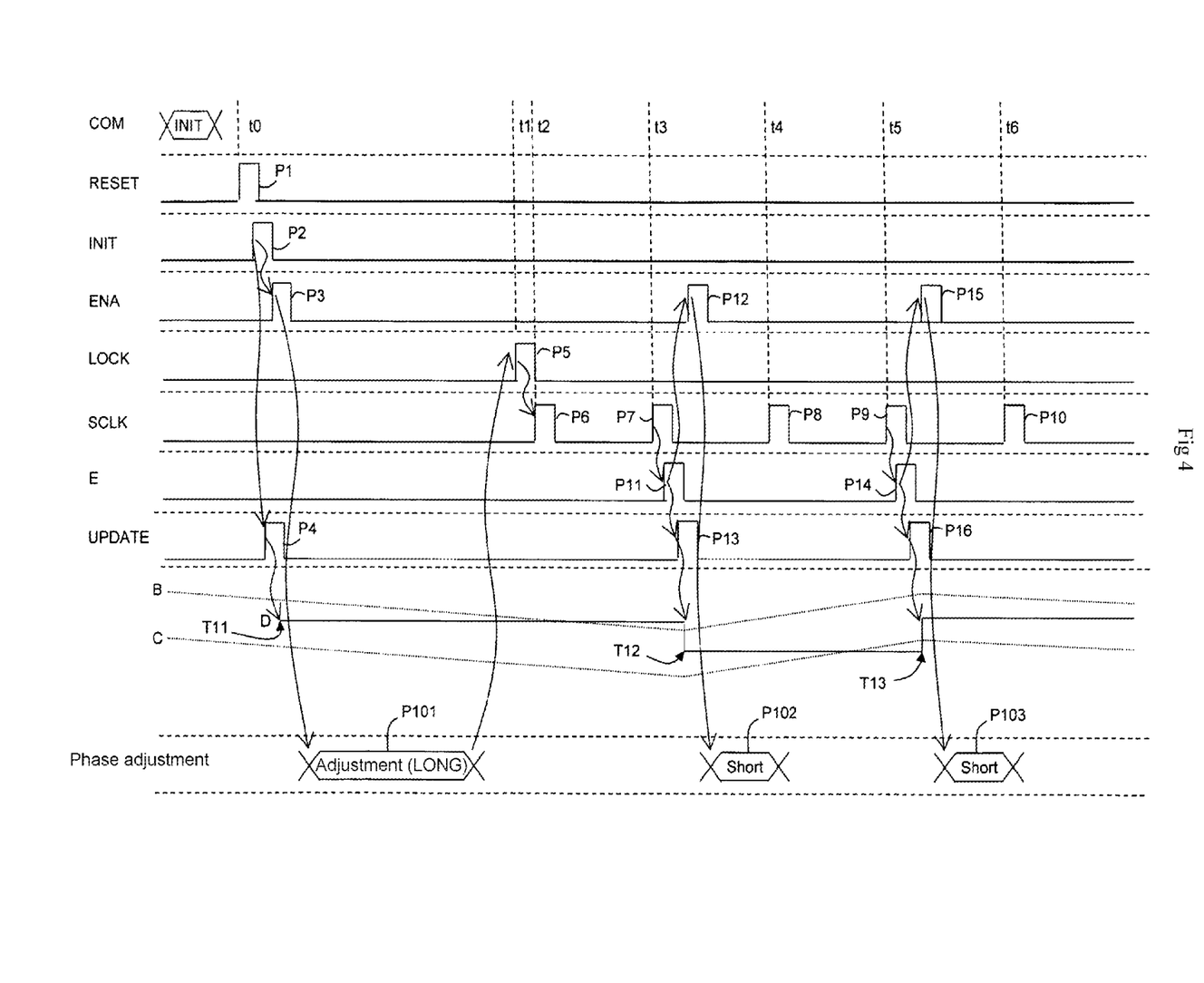
FIG. 4 is a timing chart for illustrating operation of the phase adjustment circuit 107a and the phase adjustment control circuit 107b.

FIG. 4 is a timing chart for illustrating operation of the phase adjustment circuit 107a and the phase adjustment control circuit 107b.

At the time t0, a control circuit (not depicted) connected to the semiconductor device 100 first of all outputs a reset signal to the command terminal group 102 in order to activate the phase adjustment circuit 107a, during what is known as an initialization sequence after the power has been switched on, and the control circuit also outputs to the command terminal group 102 an initialization signal indicating that the initialization sequence is in progress.

The reset signal and the initialization signal are each supplied to the command input circuit 108 via the command terminal group 102.

When the command input circuit 108 receives the reset signal from the command terminal group 102, the command input circuit 108 outputs an activated reset signal RESET (the signal P1 in FIG. 4) to the phase adjustment circuit 107a and the phase adjustment control circuit 107b. Furthermore, when the command input circuit 108 receives the initialization signal from the command terminal group 102, the command input circuit 108 outputs the activated initialization signal INIT (the signal P2 in FIG. 4) to the phase adjustment control circuit 107b.

In the phase adjustment circuit 107a, the counter circuit 5 receives the activated reset signal RESET and initializes the count value to a preset value in accordance with the activated reset signal RESET.

Meanwhile, in the phase adjustment control circuit 107b, the SR latch 11 receives the activated reset signal RESET and deactivates ("L") the output signal from the output terminal Q in accordance with the activated reset signal RESET. When the output signal from the output terminal Q of the SR latch 11 is deactivated ("L"), the determination timing control circuit 12 assumes a deactivated state and the comparison timing signal SCLK is deactivated ("L").

After this, in the phase adjustment control circuit 107b, when the update control circuit 15a receives the activated initialization signal INIT, it outputs to the phase adjustment circuit 107a an activated enable signal ENA (the signal P3 in FIG. 4), in accordance with the activated initialization signal INIT, and when the update control circuit 15b receives the activated initialization signal INIT, it outputs to the switch circuit 15c an activated update signal UPDATE (the signal P4 in FIG. 4), in accordance with the activated initialization signal INIT.

In the phase adjustment circuit 107a, when the phase comparison circuit 3, update timing generation circuit 4 and counter circuit 5 receive the activated enable signal ENA, a phase adjustment operation (phase P101 in FIG. 4) is initiated.

Meanwhile, the switch circuit 15c assumes an ON state when it receives the activated update signal UPDATE. The voltage at the connection A is therefore supplied to the holding circuit 13 via the switch circuit 15c, and the holding circuit 13 holds the voltage at the connection A as a reference voltage D (timing T11 in FIG. 4).

After this, when a situation is reached in which the phase of the internal clock signal ICLK and the phase of the replica clock signal RCLK are matching (the time t1) as a result of the phase adjustment operation performed by the phase adjustment circuit 107a, the counter circuit 5 outputs an activated lock signal LOCK (the signal P5 in FIG. 4) to the phase comparison circuit 3, update timing generation circuit 4 and SR latch 11, after which operation is stopped.

When the phase comparison circuit 3 and the update timing generation circuit 4 receive the activated lock signal LOCK, operation is stopped.

Furthermore, when the SR latch 11 receives the activated lock signal LOCK, an output signal from the output terminal Q is activated.

When the output signal from the output terminal Q of the SR latch 11 is activated, the determination timing control circuit 12 assumes an active state and outputs to the comparison circuits 15d and 15e the activated comparison timing signal SCLK (in FIG. 4, the signal P6 at the time t2, the signal P7 at the time t3, the signal P8 at the time t4, the signal P9 at the time t5, and the signal P10 at the time t6) each time the internal clock signal ICLK counts a predetermined number of times.

The comparison circuits 15d and 15e assume an active state when they receive the activated comparison timing signal SCLK; the comparison circuit 15d compares the voltage at the connection B with the reference voltage D held in the holding circuit 13, and the comparison circuit 15e compares the voltage at the connection C with the reference voltage D held in the holding circuit 13.

At the time t2, the voltage at the connection B is greater than the reference voltage D, while the reference voltage D is greater than the voltage at the connection C, and therefore the output signal of the comparison circuit 15d is "H" and the output signal of the comparison circuit 15e is also "H".

The output signal E of the NAND circuit 15f therefore assumes the deactivated state ("L") and the enable signal ENA from the update control circuit 15a and the update signal UPDATE from the update control circuit 15b are both deactivated.

Accordingly, the phase adjustment circuit 107a does not execute the phase adjustment operation in accordance with the activated comparison timing signal SCLK (the signal P6 in FIG. 4) at the time t2. Furthermore, nor is the reference voltage D held in the holding circuit 13 altered in accordance with the activated comparison timing signal SCLK (the signal P6 in FIG. 4) at the time t2.

It should be noted that a situation in which the voltage at the connection B is greater than the reference voltage D while the reference voltage D is greater than the voltage at the connection C, constitutes a situation in which the change in power source voltage is not large and there is only a small need for the phase adjustment circuit 107a to readjust the phase difference between the internal clock signal ICLK and the input/output clock signal LCLK.

In this way, in a situation in which the voltage at the connection B is greater than the reference voltage D while the reference voltage D is greater than the voltage at the connection C, in other words in a situation in which there is only a small need to execute the phase adjustment operation, said phase adjustment operation is not carried out and therefore it is possible to restrict power consumption.

It should be noted that if the activated comparison timing signal SCLK is not being received, the comparison circuits 15d and 15e output an "H"-level signal. Accordingly, in this case too, neither the enable signal ENA from the update control circuit 15a nor the update signal UPDATE from the update control circuit 15b is activated.

At the subsequent timing t3, both the voltage at the connection B and the voltage at the connection C are lower than the reference voltage D due to a fluctuation in the power source voltage VDDQ/VSSQ. Consequently, the output signal of the comparison circuit 15d becomes "L" and the output signal of the comparison circuit 15e becomes "H".

Accordingly, the output signal E of the NAND circuit 15f assumes an active state ("H") (the signal P11 in FIG. 4), and the enable signal ENA from the update control circuit 15a and the update signal UPDATE from the update control circuit 15b are both activated (the signals P12 and P13 in FIG. 4).

As a result, the phase adjustment circuit 107a executes the phase adjustment operation in accordance with the activated enable signal ENA (the signal P12 in FIG. 4) (phase P102 in FIG. 4).

Furthermore, the reference voltage D held in the holding circuit 13 is also altered to the value of the voltage at the connection A at the timing T12 in FIG. 4, in accordance with the activated update signal UPDATE (the signal P13 in FIG. 4).

At the subsequent time t4, the voltage at the connection B is greater than the reference voltage D while the reference voltage D is greater than the voltage at the connection C, and therefore the output signal of the comparison circuit 15d becomes "H" and the output signal of the comparison circuit 15e also becomes "H". In the same way as at the time t2, the phase adjustment operation is therefore not executed and the reference voltage D held in the holding circuit 13 is not altered either.

At the subsequent time t5, both the voltage at the connection B and the voltage at the connection C are greater than the reference voltage D due to a fluctuation in the power source voltage VDDQ/VSSQ. Consequently, the output signal of the comparison circuit 15d becomes "H" and the output signal of the comparison circuit 15e becomes "L".

Accordingly, the output signal E of the NAND circuit 15f assumes an active state ("H") (the signal P14 in FIG. 4), and the enable signal ENA from the update control circuit 15a and the update signal UPDATE from the update control circuit 15b are both activated (the signals P15 and P16 in FIG. 4).

As a result, the phase adjustment circuit 107a executes the phase adjustment operation in accordance with the activated enable signal ENA (the signal P15 in FIG. 4) (phase P103 in FIG. 4).

Furthermore, the reference voltage D held in the holding circuit 13 is also altered to the value of the voltage at the connection A at the timing T13 in FIG. 4, in accordance with the activated update signal UPDATE (the signal P16 in FIG. 4).

At the subsequent time t6, the voltage at the connection B is greater than the reference voltage D while the reference voltage D is greater than the voltage at the connection C, and therefore the output signal of the comparison circuit 15d becomes "H" and the output signal of the comparison circuit 15e also becomes "H". In the same way as at the time t2, the phase adjustment operation is therefore not executed and the reference voltage D held in the holding circuit 13 is not altered either.

The advantage of the mode of embodiment will be described next.

The control unit 15 inside the phase adjustment control circuit 107b intermittently compares the comparison voltage from the comparison voltage generation unit 14 and the reference voltage held in the holding circuit 13, and if the comparison result satisfies a predetermined condition indicating a fluctuation in the power source voltage VDDQ, said control unit 15 causes the phase adjustment circuit 107a to execute an adjustment operation, and also alters the reference voltage held in the holding circuit 13, in accordance with the power source voltage VDDQ.

Therefore, even if the power source voltage is fluctuating, the phase adjustment operation is not implemented if the result of comparing the reference voltage used immediately before with the relevant voltage does not satisfy a predetermined condition, in other words if the difference of the comparison is small, and current consumption can be reduced.

Furthermore, when the phase adjustment operation is executed, the voltage at the time of execution is taken as the reference voltage for alteration. The need for a phase adjustment operation is therefore based on a large variation in the power source voltage from the previous update and is not necessarily associated with the absolute value of the power source voltage. In other words, if the power source voltage varies by a large amount at one time and then stabilizes, phase adjustment is not necessarily required after an update when there is a large variation. It is thus possible to restrict execution of a phase adjustment operation for which there is only a small need.

According to the mode of embodiment, the control unit 15 outputs an activated enable signal ENA to the phase adjustment circuit 107a if the comparison result does not satisfy a predetermined condition. The phase adjustment circuit 107a executes the phase adjustment operation when the activated enable signal ENA has been received.

Execution of the phase adjustment operation can therefore be controlled using the activated enable signal ENA.

The invention of this application has been described with reference to a mode of embodiment but the invention of this application is not limited to the mode of embodiment described above. The configuration and details of the invention of this application may be modified in various ways that can be understood by a person skilled in the art within the scope of the invention of this application. This application claims priority on the basis of Japanese Patent Application 2013-5411 filed on Jan. 16, 2013, the disclosure of which is incorporated herein in its entirety.

KEY TO SYMBOLS

100 Semiconductor device
101 Clock terminal group
102 Command terminal group
103 Address terminal group
104 Data input/output terminal group
105 Power source terminal group
106 Clock input circuit
107 Input/output clock generation unit
107a Phase adjustment circuit
107b Phase adjustment control circuit
108 Command input circuit
109 Command decoding circuit
110 Refresh control circuit
111 Address input circuit
112 Address latch circuit
113 Mode register
114 Memory cell array
115 Row decoder
116 Column decoder
117 FIFO circuit
0118 Input/output circuit
119 Internal power source generation circuit
BL Bit line
WL Word line
MC Memory cell
1 Signal adjustment circuit
2 Replica circuit
3 Phase comparison circuit
4 Update timing generation circuit
5 Counter circuit
11 SR latch
12 Determination timing control circuit
13 Holding circuit
14 Comparison voltage generation unit
14a, 14a1, 14a2, 14b, 14b1, 14b2 Resistor
15 Control unit
15a, 15b Update control circuit
15c Switch circuit
15d, 15e Comparison circuit
15f NAND circuit

The invention claimed is:
1. An output signal generation device including:
a phase adjustment unit configured to generate an output signal in accordance with an input signal, and execute an adjustment operation in which the phase difference between the input signal and the output signal is set to a predetermined value;
a holding unit for holding a reference voltage;
a comparison voltage generation unit for generating a comparison voltage dependent on a power source voltage; and
a control unit which intermittently compares the comparison voltage and the reference voltage held in the holding unit, and when the comparison result satisfies a predetermined condition indicating a fluctuation in the power source voltage, the control unit causes the phase adjustment unit to execute the adjustment operation, and also alters the reference voltage held in the holding unit, in accordance with the power source voltage.

2. The output signal generation device as claimed in claim 1, wherein the control unit outputs an adjustment signal to the phase adjustment unit when the comparison result satisfies the predetermined condition, and the phase adjustment unit executes the adjustment operation when the adjustment signal has been received.

3. The output signal generation device as claimed in claim 1, including first and second resistors which are connected in series and split the power source voltage;

wherein the control unit causes the phase adjustment unit to execute the adjustment operation when the comparison result satisfies the predetermined condition, and also alters the value of the reference voltage held in the holding unit to the value of the voltage at the connection of the first and second resistors at that point in time.

4. The output signal generation device as claimed in claim 3, wherein the comparison voltage generation unit includes the first and second resistors;

wherein the first resistor has third and fourth resistors connected in series;

wherein the second resistor has fifth and sixth resistors connected in series; and wherein the comparison voltage generation unit generates, as the comparison voltage, a voltage at a first connection which is the connection of the third and fourth resistors, and a voltage at a second connection which is the connection of the fifth and sixth resistors.

5. The output signal generation device as claimed in claim 4, wherein the predetermined condition is a condition under which the reference voltage held in the holding unit is greater than each of the voltage at the first connection and the voltage at the second connection, or is lower than each of the voltage at the first connection and the voltage at the second connection.

6. The output signal generation device as claimed in any one of claims 1, wherein the control unit compares the comparison voltage and the reference voltage held in the holding unit at a period specified in accordance with the input signal.

7. A semiconductor device including:

an output signal generation device including:

a phase adjustment unit configured to generate an output signal in accordance with an input signal, and execute an adjustment operation in which the phase difference between the input signal and the output signal is set to a predetermined value;

a holding unit for holding a reference voltage;

a comparison voltage generation unit for generating a comparison voltage dependent on a power source voltage; and a control unit which intermittently compares the comparison voltage and the reference voltage held in the holding unit, and when the comparison result satisfies a predetermined condition indicating a fluctuation in the power source voltage, the control unit causes the phase adjustment unit to execute the adjustment operation, and also alters the reference voltage held in the holding unit, in accordance with the power source voltage;

a memory cell; and an input/output unit which writes data to the memory cell or reads data from the memory cell in accordance with an output signal generated by the output signal generation device.

8. An output signal generation method performed by an output signal generation device including a phase adjustment unit configured to generate an output signal in accordance with an input signal, and execute an adjustment operation in which the phase difference between the input signal and the output signal is set to a predetermined value, in which method:

a reference voltage is held in a holding unit;

a comparison voltage dependent on a power source voltage is generated; and the comparison voltage and the reference voltage held in the holding unit are intermittently compared, and when the comparison result satisfies a predetermined condition indicating a fluctuation in the power source voltage, the phase adjustment unit is caused to execute the adjustment operation, and the reference voltage held in the holding unit is also altered in accordance with the power source voltage.

* * * * *